United States Patent [19]
Thompson

[11] Patent Number: 6,113,693
[45] Date of Patent: Sep. 5, 2000

[54] UNIVERSAL FIXTURE FOR HOLDING PRINTED CIRCUIT BOARDS DURING PROCESSING

[75] Inventor: Curtis C. Thompson, Meridian, Id.

[73] Assignee: MCMS, Inc., Nampa, Id.

[21] Appl. No.: 09/001,533

[22] Filed: Dec. 31, 1997

Related U.S. Application Data

[62] Division of application No. 08/761,701, Dec. 6, 1996, Pat. No. 5,779,794.

[51] Int. Cl.⁷ .................................................. B05C 13/02
[52] U.S. Cl. ............................ 118/500; 101/126; 269/56; 269/71; 269/118; 269/119; 269/287; 269/903
[58] Field of Search .................................. 118/500, 213, 118/301, 406; 101/126; 269/55, 56, 71, 111, 118, 119, 287, 289 R, 903

[56] References Cited

U.S. PATENT DOCUMENTS

| | | | |
|---|---|---|---|
| 2,038,771 | 4/1936 | Stroud . | |
| 2,458,302 | 1/1949 | Richardson et al. . | |
| 3,930,644 | 1/1976 | Albert, Jr. ................. | 269/118 |
| 4,030,717 | 6/1977 | Serlovsky ................. | 269/118 |
| 4,159,176 | 6/1979 | de Masi ..................... | 355/79 |
| 4,186,916 | 2/1980 | Varga . | |
| 4,291,867 | 9/1981 | Williams et al. ........... | 269/43 |
| 4,505,198 | 3/1985 | Dee et al. ................. | 118/213 |
| 4,768,698 | 9/1988 | Brown et al. . | |
| 4,814,698 | 3/1989 | St. Onge et al. ........ | 324/158 |
| 5,003,254 | 3/1991 | Hunt et al. . | |
| 5,067,648 | 11/1991 | Cascini . | |
| 5,332,439 | 7/1994 | Watanabe et al. ....... | 118/213 |
| 5,522,929 | 6/1996 | Erdmann ................. | 118/213 |
| 5,603,474 | 2/1997 | Weber . | |
| 5,707,052 | 1/1998 | Adams et al. ............ | 269/22 |
| 5,716,043 | 2/1998 | Iwata et al. . | |
| 5,838,538 | 11/1998 | Yee ......................... | 361/683 |

*Primary Examiner*—Laura Edwards
*Attorney, Agent, or Firm*—Perkins Coie LLP

[57] ABSTRACT

The present invention is a universal fixture for holding printed circuit boards with different sizes and shapes during, stencil printing and other manufacturing processes related to printed circuit boards. In one embodiment, a universal fixture for holding a printed circuit board has a platform with a work surface, a first support member attached to the platform to hold a portion of a printed circuit board, and a second moveable support member attached to the first support member to support another portion of the printed circuit board. The platform is preferably adapted to be attached to a workstation of a processing machine, such as a stenciling machine for printing solder or adhesive onto the printed circuit board. The first support member preferably has an elongated sidewall, a first endwall extending transversely from the sidewall, and a second endwall spaced apart from the first endwall along the sidewall and extending transversely from the sidewall. The sidewall and both the first and second endwalls preferably project away from the work surface of the platform to define a first support rim spaced apart from the work surface. Additionally, the second support member is preferably spaced apart from the sidewall and extends from the first endwall to the second endwall. The second support member preferably translates along the first and second endwalls to adjust the distance between the sidewall and the second support member such that the first and second support surfaces support perimeter regions of printed circuit boards with different sizes along the dimension between the second support member and the sidewall.

6 Claims, 7 Drawing Sheets

UNIVERSAL FIXTURE FOR HOLDING PRINTED CIRCUIT BOARDS DURING PROCESSING

CROSS-REFERENCE TO RELATED APPLICATION

This application is a divisional application of U.S. patent application Ser. No. 08/761,701, filed Dec. 6, 1996, which has now issued as U.S. Pat. No. 5,779,794.

TECHNICAL FIELD

The present invention relates to processing printed circuit boards, and more specifically to an apparatus that holds printed circuit boards during stencil printing processes for surface mounting components on the printed circuit boards.

BACKGROUND OF THE INVENTION

Printed circuit boards ("PCBs") with electrical components are used in computers, communications equipment, televisions, and many other products. In typical applications, through-hole mounting and surface mounting techniques are used to attach electrical components to the top and/or bottom surfaces of PCBs. Since the electronics manufacturing industry is highly competitive, it is important to maximize the throughput of PCB processing and to securely attach the electrical components to the PCBs.

To surface mount components to a PCB, a solder and/or an adhesive compound is deposited onto the surfaces of the PCB, and then the components are pressed against the solder/adhesive. The solder/adhesive is preferably deposited onto the PCB with a highly accurate stenciling machine. Conventional stenciling machines generally have a stencil plate, a moveable work platform under the stencil plate, and a PCB holder attached to the platform. Conventional stenciling machines also have two spaced-apart, parallel conveyor tracks that transport the PCB along a conveyor line below the stencil plate but above the moveable platform.

In operation, the conveyor tracks transport the PCB until it is over the PCB holder, and then the work platform moves upwardly to engage the PCB holder with the bottom side of the PCB and lift the PCB to the stencil plate. Once the PCB is pressed against the stencil plate, a wiper moves across the stencil plate to press a solder or an adhesive through holes in the stencil plate and onto the top surface of the PCB. The work platform then moves downwardly away from the bottom surface of the stencil plate to replace the PCB on the conveyor rails.

Although conventional stenciling machines work well for processing large quantities of PCBs with a single size and shape, they are not well suited for contract PCB manufacturing in which five or more runs of PCBs with different sizes and shapes are processed in a single day. One problem with conventional PCB stenciling machines is that conventional PCB holders typically have a single size and shape to hold a single type of PCB. As a result, to adapt conventional stenciling machines to print on PCBs with different sizes and shapes, custom PCB assembly lines are typically shut down several times each day to replace one PCB holder with another having a different size. It will be appreciated that the downtime to change out the PCB holders significantly reduces the throughput of a PCB assembly line. Therefore, it would be desirable to develop an apparatus that reduces downtime in stenciling a solder or an adhesive in contract PCB manufacturing.

Another problem with conventional PCB stenciling machines is that the top surface of the PCB should be very flat as it presses against the bottom side of the stenciling plate to ensure that an adequate quantity of solder or adhesive is deposited uniformly across the PCB. To hold the PCB flat during the stenciling process, the PCB is generally attached to the PCB holder by a vacuum drawn against the bottom side of a PCB. Although holding the PCB to the PCB holder with a vacuum is desirable, only fixed-sized PCB holders are currently used with vacuum mounting systems to ensure that an adequate vacuum is maintained against the bottom side of a PCB. Therefore, it would also be desirable to develop a vacuum mounting apparatus that reduces downtime in stenciling a solder and an adhesive in contract PCB manufacturing.

SUMMARY OF THE INVENTION

The present invention is a universal fixture for holding printed circuit boards with different sizes and shapes during stenciling and other manufacturing processes related to printed circuit boards. In one embodiment, a universal fixture for holding a printed circuit board has a platform with a work surface, a first support member attached to the platform to hold a portion of a printed circuit board, and a second moveable support member attached to the first support member to support another portion of the printed circuit board. The platform is preferably adapted to be attached to a workstation of a processing machine, such as a stenciling machine for printing a solder or an adhesive onto the printed circuit board. The first support member preferably has an elongated sidewall, a first endwall extending transversely from the sidewall, and a second endwall spaced apart from the first endwall along the sidewall and extending transversely from the sidewall. The sidewall and both endwalls preferably project away from the work surface of the platform to define a first support rim spaced apart from the work surface. Additionally, the second support member is preferably spaced apart from the sidewall and attached to the first endwall and the second endwall. The second support member is adapted to translate along the first and second endwalls to adjust the distance between the sidewall and the second support member such that the sidewall and the second support member support printed circuit boards with different sizes.

In another embodiment, a universal fixture for holding a printed circuit board has a platform with a work surface and a plurality of walls projecting upwardly from the platform. The plurality of walls define an adjustable support rim that may be sized and shaped to support the bottom side of a printed circuit board with different sizes and shapes. The platform is preferably adapted to be attached to a workstation of a printed circuit board processing machine, and the plurality of panels preferably includes first, second, third and fourth panels that each have an elongated top edge. The first panel is positioned on the work platform, and the second and third panels are attached to the first panel and extend transversely with respect to the top edge of the first panel. The second and third panels are also spaced apart from one another along a common side of the first panel. The fourth panel is spaced apart from the common side of the first panel, and at least one of the first and fourth panels moves with respect to the other to adjust the distance between the first and fourth panels. In one embodiment, the fourth panel translates along the second and third panels to selectively position the elongated edge of the fourth panel a desired distance from the elongated edge of the first panel. Thus, the first and fourth panels are positioned with respect to each other to support different printed circuit boards with different sizes along the dimension between the first and fourth panels.

DETAILED DESCRIPTION OF THE INVENTION

The present invention is a universal PCB holder that supports PCBs with different sizes and shapes during processing of the PCBs. An important aspect of an embodiment of the invention is that the universal PCB holder has at least one adjustable support member that may be quickly moved between runs of differently sized PCBs to change the dimensions of the PCB holder. Thus, PCBs with different sizes and shapes may be assembled without shutting down the PCB assembly line for significant periods of time. FIGS. 1–9, in which like reference numbers refer to like part throughout the various figures, illustrate printed circuit board stenciling machines and universal PCB holders in accordance with the invention.

Figure 1:
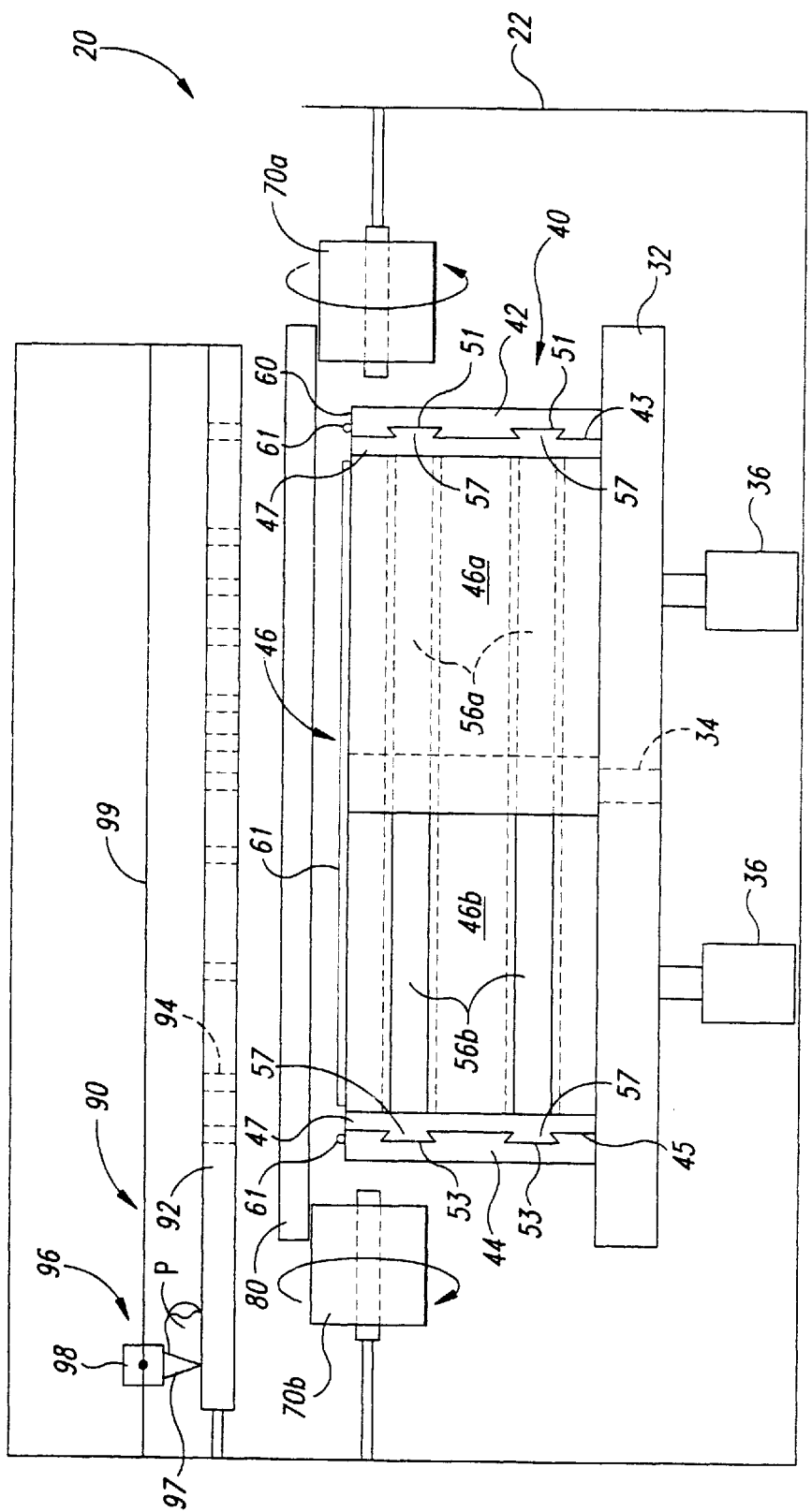
FIG. 1 is a side elevational view of a printed circuit board stenciling machine in accordance with one embodiment of the invention.
Figure 2:
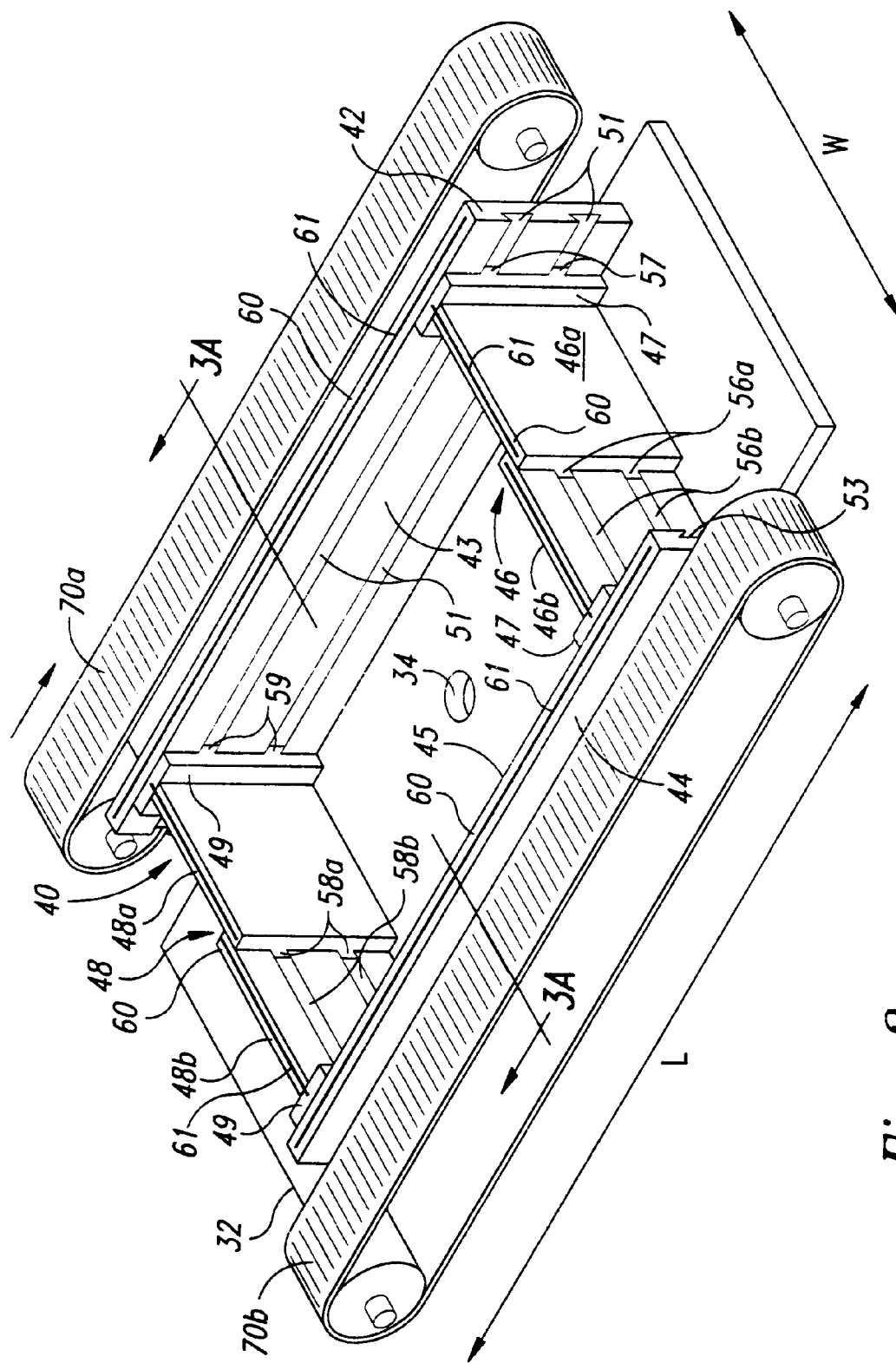
FIG. 2 is a partial isometric view of the printed circuit board stenciling machine of FIG. 1.

FIG. 1 is a side elevational view and FIG. 2 is a partial isometric view of a stenciling machine 20 in accordance with the invention for depositing a solder and/or an adhesive onto a PCB. In one embodiment, the stenciling machine 20 has a moveable platform 32, a universal PCB holder 40 on the platform 32, conveyor tracks 70(a) and 70(b) outside of the PCB holder 40, and a stenciling assembly 90 above the conveyor tracks 70(a) and 70(b). The platform 32 is attached to a number of actuators 36 that raise and lower the universal PCB holder 40 to lift a PCB workpiece 80 off of the conveyor tracks 70(a) and 70(b). In a preferred embodiment, the platform 32 has a vacuum port 34 to which a vacuum pump (not shown) may be coupled to draw a vacuum within the PCB holder 40 against the PCB 80. The stenciling device 20 preferably has a housing 22 or other support structure to which the actuators 36, the conveyor tracks 70(a) and 70(b), and the stenciling assembly 90 are attached. One suitable stenciling machine that has a moveable platform 32, conveyor tracks 70(a) and 70(b), and a stenciling assembly 90 is the Ultraprint stenciling machine manufactured by MPM Corporation.

The PCB holder 40 shown in FIGS. 1 and 2 is a preferred embodiment of the invention that is adjustable in two dimensions. As best shown in FIG. 2, the PCB holder 40 preferably has first and second elongated sidewalls or panels 42 and 44 extending along a lengthwise dimension L of the PCB holder 40. Additionally, the PCB holder 40 preferably has first and second elongated endwalls or panels 46 and 48 extending transversely to the first and second sidewalls 42 and 44 along a widthwise dimension W. The sidewalls 42 and 44 are preferably fixed-length support members, and the endwalls 46 and 48 are preferably adjustable-length support members that slide along the sidewalls 42 and 44. Thus, to change the size of the PCB holder 40 along the lengthwise dimension L, the endwalls 46 and 48 are translated along the sidewalls 42 and 44 to adjust the distance between the endwalls 46 and 48. Similarly, to change the size of the PCB holder 40 in the widthwise dimension W, the lengths of the endwalls 46 and 48 are changed to adjust the distance between the sidewalls 42 and 44.

Referring to FIGS. 1 and 2 together again, the first sidewall 42 preferably has a plurality of spaced-apart channels 51 extending in the lengthwise dimension L along at least a portion of the interior surface 43 of the first sidewall 42. The second sidewall 44 similarly has a plurality of spaced-apart channels 53 (best shown in FIG. 1) extending in the lengthwise dimension L along at least a portion of the interior surface 45 of the second sidewall 44. A plurality of slider blocks 47 and 49 are slideably attached to the sidewalls 42 and 44. The slider blocks 47 each have keys 57 that mate with the channels 51 and 53, and the slider blocks 49 each have keys 59 that also mate with the channels 51 and 53. The keys 57 and 59, and the channels 51 and 53 are preferably shaped to hold the slider blocks 47 and 49 to the first and second sidewalls 42 and 44 in a manner that allows the slider blocks 47 and 49 to translate along the first and second sidewalls 42 and 44 in the lengthwise dimension L. In this embodiment of the invention, each end of the first endwall 46 is attached to a slider block 47 and each end of the second endwall 48 is attached to a slider block 49. Accordingly, the endwalls 46 and 48 are slideably coupled to the sidewalls 42 and 44 via the slider blocks 47 and 49, respectively.

In a preferred embodiment, the first and second endwalls 46 and 48 each have a plurality of slideably connected elongated sections or panels that translate with respect to one another to adjust the lengths of the first and second endwalls 46 and 48. For example, the first endwall 46 preferably has a first section 46(a) slideably connected to a second section 46(b), and the second endwall 48 preferably has a first section 48(a) slideably connected to a second section 48(b). The first endwall sections 46(a) and 48(a) preferably have a plurality of elongated rails 56(a) and 58(a), respectively. Conversely, the second endwall sections 46(b) and 48(b) preferably have a plurality of channels 56(b) and 58(b), respectively. The rails 56(a) slideably mate with the channels 56(b) so that the first and second sections 46(a) and 46(b) of the first endwall 46 translate with respect to each other to adjust the length of the first endwall 46. Similarly, the elongated rails 58(a) slideably mate with the channels 58(b) so that the first and second sections 48(a) and 48(b) of the second endwall 48 translate with respect to each other to adjust the length of the second endwall 48. Additionally, the first and second sections 46(a) and 46(b) of the first endwall 46 are preferably each attached to one of the slider blocks 47, and the first and second sections 48(a) and 48(b) of the second endwall 48 are each preferably attached to one of the slider blocks 49.

The walls 42, 44, 46 and 48 are preferably placed on the platform 32 to be freely translated with respect to one another to adjust the size of the PCB holder 40. The walls 42, 44, 46 and 48 also project upwardly from the surface of the platform 32 to define elongated support surfaces 60 for holding the PCB 80 (shown in FIG. 1). Additionally, a seal 61(a) is preferably positioned on the top surfaces 60 of the walls 42, 44, 46 and 48 to efficiently maintain a vacuum against the backside of a PCB.

Figure 3A:
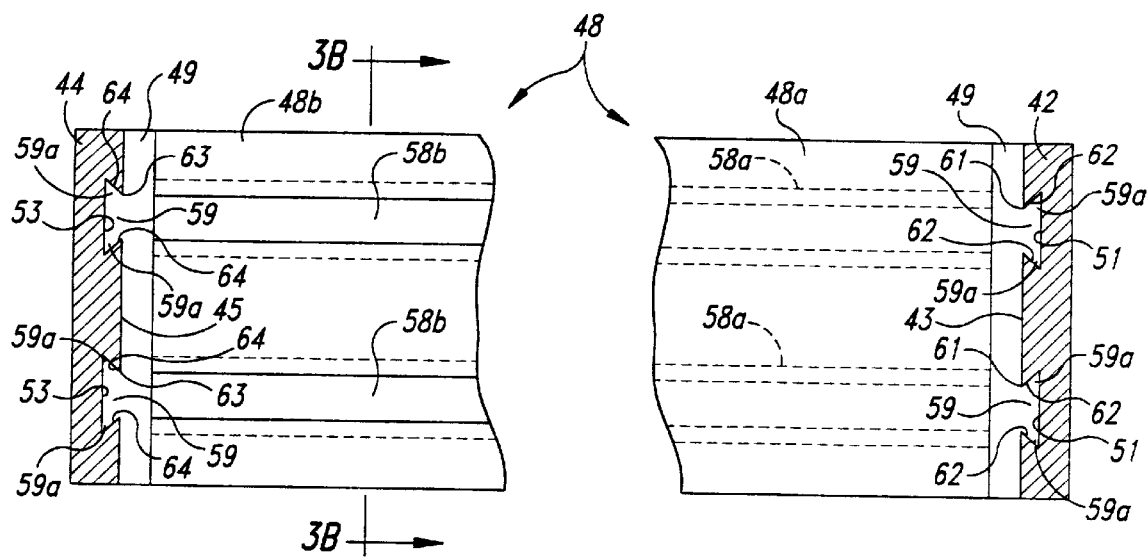
FIG. 3A is a cross-sectional view of the printed circuit board holder used in the embodiment of FIGS. 1 and 2 taken along the line 3A—3A of FIG. 2.

FIG. 3A is a cross-sectional view of a preferred embodiment of the slideable connections between the second endwall 48 and the sidewalls 42 and 44. In a preferred embodiment, each channel 51 has retaining surfaces 62 that extend divergently from an elongated opening 61 at the interior surface 43 of the first sidewall 42 to an intermediate point within the first sidewall 42. Similarly, each channel 53 has retaining surfaces 64 that extend divergently from an elongated opening 63 at the interior surface 45 of the second sidewall 44 to an intermediate depth within the second sidewall 44. The keys 59 on the slider blocks 49 preferably have divergent rims 59(a) that mate with the retaining surfaces 62 and 64. The keys 59 are preferably shaped to fill the channels 51 and 53, and to hold the slider blocks 49 against the interior surfaces 43 and 45 of the sidewalls 42 and 44, respectively. Thus, the slider blocks 47 and 49 can translate along the sidewalls 42 and 44 to adjust the distance between the endwalls 46 and 48 along the lengthwise dimension L and they allow a vacuum to be drawn in the PCB holder 40.

Figure 3B:
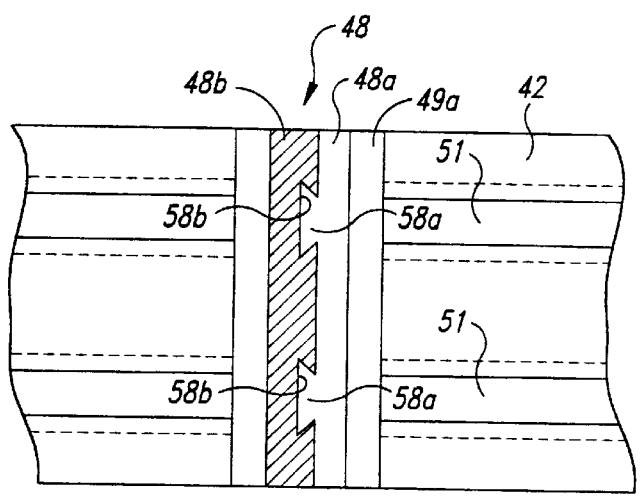
FIG. 3B is a cross-sectional view taken along the line 3B—3B of FIG. 3A.

FIG. 3B is a cross-sectional view of a preferred embodiment of the slideable connections between the first and second sections 48(a) and 48(b) of the second endwall 48. The rails 58(a) of the first section 48(a) preferably have a cross-sectional shape similar to the keys 59 of the slider block 49. Similarly, the channels 58(b) of the second section 48(b) preferably have a cross-sectional shape similar to the channels 51 and 53 of the sidewalls 42 and 44. Additionally, the rails 58(a) preferably mate with the channels 58(b) to prevent substantial leaking between the first and second sections 48(a) and 48(b) of the second endwall 48. The first and second sections 48(a) and 48(b) of the second endwall 48 accordingly translate with respect to one another to change the length of the second endwall 48 along the widthwise dimension W and they allow a vacuum to be drawn in the PCB holder 40.

The first section 46(a) of the first endwall 46 has rails 56(a) similar to rails 58(a) of the second endwall 48, and the second section 46(b) of the first endwall 46 preferably has channels 56(b) similar to channels 58(b) of the second endwall 48. Accordingly, the first and second sections 46(a) and 46(b) of the first endwall 46 also translate with respect to one another to adjust the length of the first endwall 46 along the widthwise dimension W and allow a vacuum to be drawn in the PCB holder 40.

Figure 4A:
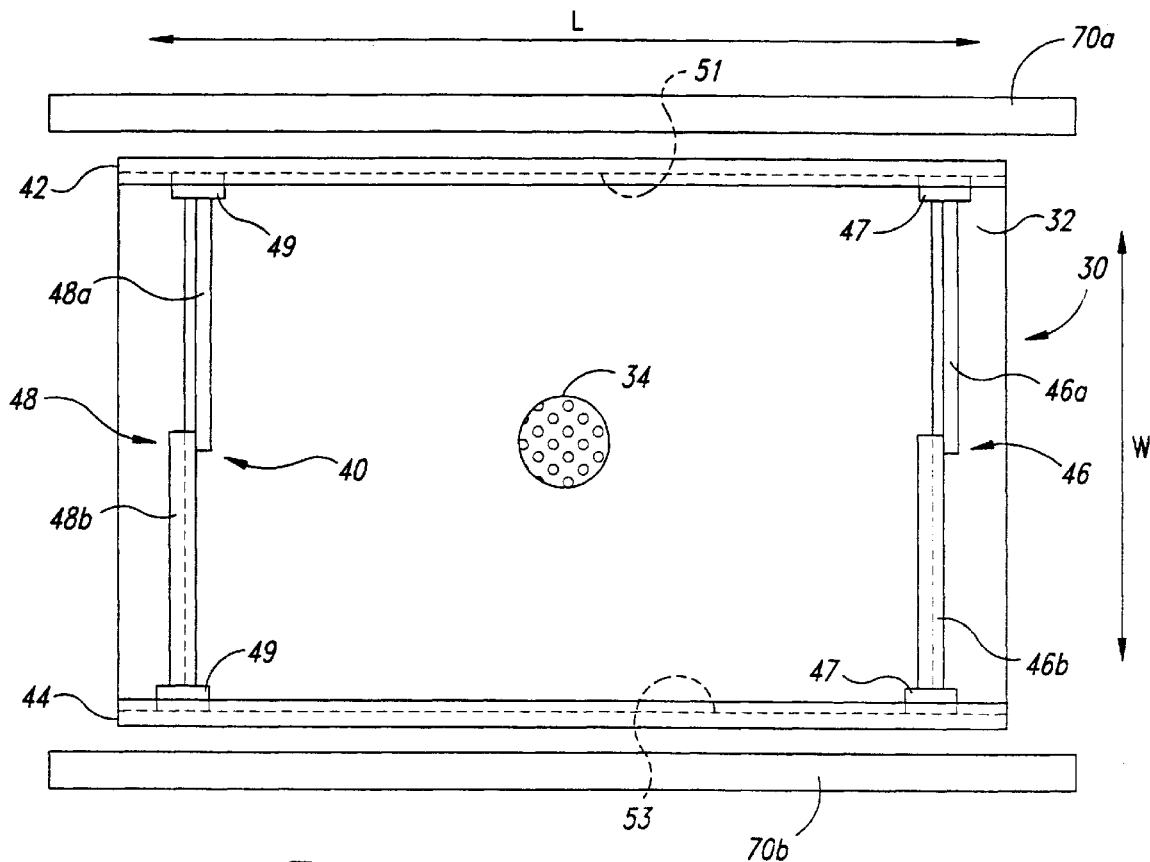
FIG. 4A is a top plan view of the embodiment of the printed circuit board holder of FIGS. 1 and 2 shown in one configuration.
Figure 4B:
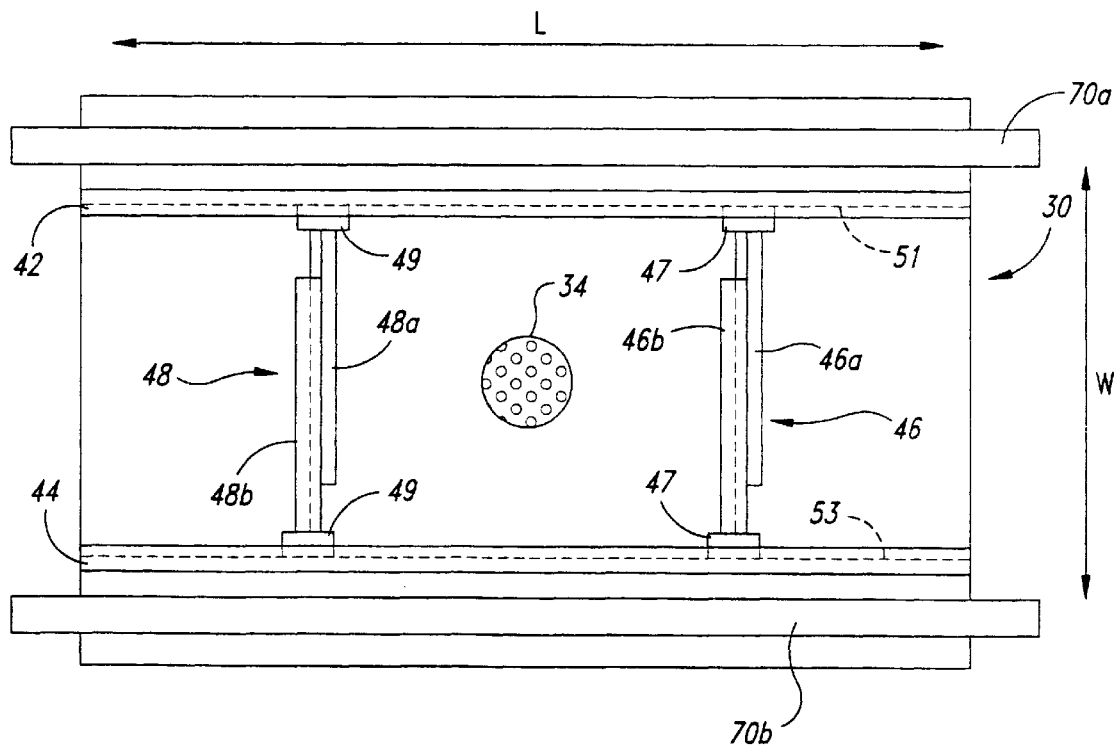
FIG. 4B is a top plan view of the printed circuit board holder of FIG. 4A in a different configuration.

FIGS. 4A and 4B are top plan views of the PCB holder 40 illustrating different configurations of the sidewalls and endwalls. Referring to FIG. 4A, the first and second endwalls 46 and 48 are configured in an extended position in which the first and second sidewalls 42 and 44 are spaced apart by a maximum distance in the widthwise dimension W. The first and second endwalls 46 and 48 are also separated from one another by nearly the full length of the sidewalls 42 and 44 along the lengthwise dimension L. Accordingly, FIG. 4A illustrates the PCB holder 40 in a configuration to support a relatively large PCB.

FIG. 4B illustrates the first and second endwalls 46 and 48 in a contracted position to reduce the distance between the first and second sidewalls 42 and 44 across the widthwise dimension W. The slide blocks 47 and 49 are also moved along the first and second sidewalls 42 and 44 to reduce the distance between the endwalls 46 and 48 along the lengthwise dimension L. The top surfaces 60 of the sidewalls 42 and 44, and the endwalls 46 and 48 are accordingly configured to support a PCB with smaller dimensions along the widthwise dimension W and the lengthwise dimension L than the configuration of the PCB holder 40 illustrated in FIG. 4A. It will be appreciated that FIGS. 4A and 4B illustrate only two configurations of the PCB holder 40, and that the walls 42, 44, 46 and 48 may each be selectively moved to position the walls under the desired portions of a specific PCB.

In an example of the operation of the stenciling machine 20 shown in FIG. 1, the conveyor tracks 70(a) and 70(b) initially position the PCB 80 over the PCB holder 40. The actuators 36 then raise the platform 32 until the PCB holder 40 lifts the PCB 80 from the conveyor tracks 70(a) and 70(b) and presses the PCB 80 against the bottom side of a stencil plate 92 of the stenciling assembly 90. A wiper assembly 96 of the stenciling assembly 90 then translates along a wiper track 99 to sweep a wiper blade 97 across the top surface of the stencil plate 92 and drive a paste compound P through a pattern of holes 94 in the stencil plate 92. After the paste P is printed onto the top surface of the PCB workpiece 80, the actuators 36 lower the PCB holder 40 to replace the PCB workpiece 80 on the conveyor tracks 70(a) and 70(b). To stencil print the paste compound P on another run of PCB workpieces having a different size than the PCB workpiece 80, the operator simply moves the stenciling assembly (90) out of the way and slides the walls 42, 44, 46 or 48 of the PCB holder 40 to adjust the support surfaces 60 of the PCB holder 40 to hold the PCB workpieces having a different size. For example, the walls 42, 44, 46 and 48 may be adjusted as shown in FIGS. 4A and 4B to hold workpieces having different sizes.

One advantage of a preferred embodiment of the universal PCB holder 40 is that it may be quickly adjusted to support PCBs with different sizes without being removed from the stenciling machine. Unlike conventional PCB stenciling devices in which the PCB holders have fixed sizes and must be changed out to accommodate PCBs with different sizes, the spacing between the walls of the preferred embodiment of the PCB holder 40 may be changed without removing the PCB holder 40 from the stenciling device 20. Therefore, the PCB holder 40 reduces downtime associated with changing the stenciling machine 20 to accommodate runs of differently sized PCBs in contract PCB manufacturing.

Figure 5:
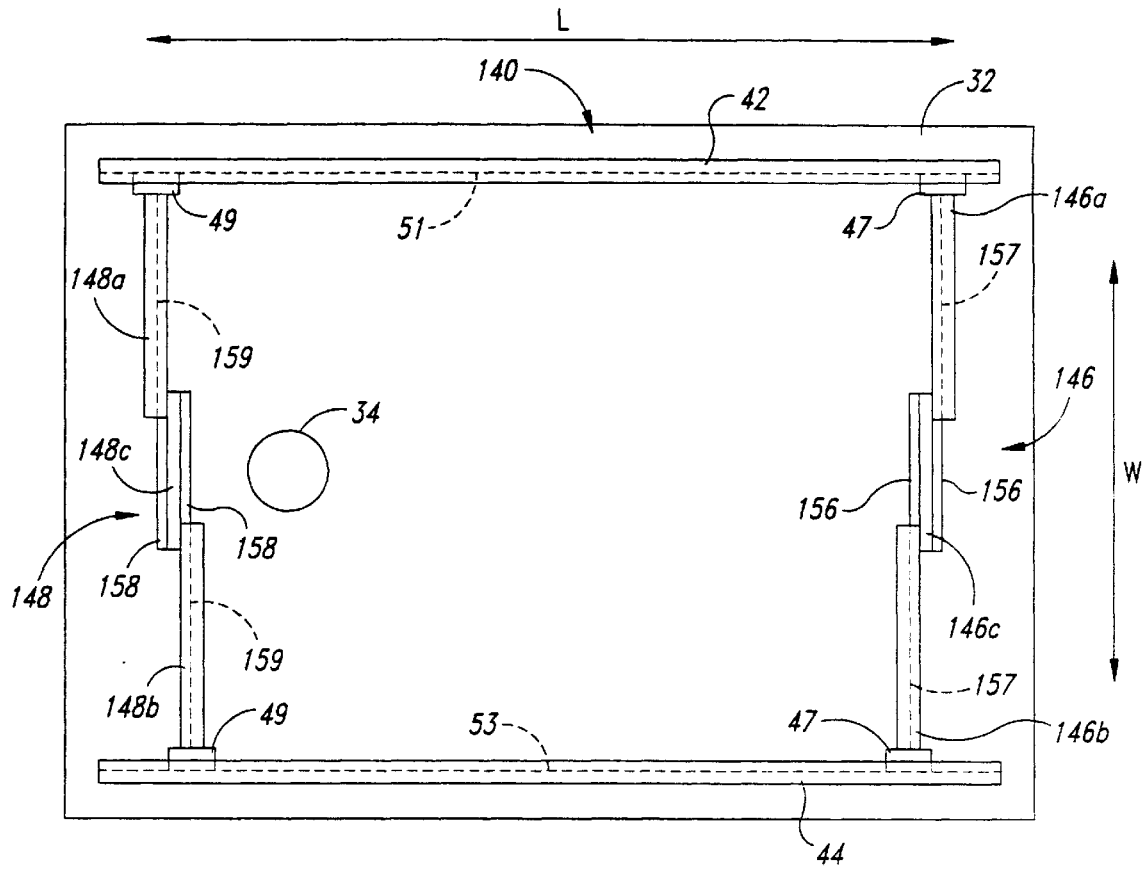
FIG. 5 is a schematic top plan view of another embodiment of a printed circuit board holder in accordance with the invention.

FIG. 5 is a top plan view that illustrates another embodiment of a PCB holder 140 that has tri-panel endwalls 146 and 148. More specifically, the first endwall 146 has a first end section 146(a) with a slider block 47 attached to the first sidewall 42, a second end section 146(b) with a slider block 47 attached to the second sidewall 44, and an intermediate section 146(c) slideably coupling the first end section 146(a) to the second end section 146(b) to allow the length of the first endwall 146 to be adjusted along the widthwise dimension W. Similarly, the second endwall 148 has a first end section 148(a) with a slider block 49 attached to the first sidewall 42, a second end section 148(a) with a slider block 49 attached to the second sidewall 44, and an intermediate section 148(c) slideably coupling the first end section 148(a) to the second end section 148(b). The endwalls 146 and 148 operate in much the same manner as the endwalls 46 and 48 of the PCB holder 40 of FIGS. 1 and 2. For example, the intermediate section 146(c) preferably has a plurality of rails 156 that slideably mate with channels 157 along the end sections 146(a) and 146(b), and the intermediate section 148(c) preferably has a plurality of rails 158 that slideably mate with channels 159 along the end sections 148(a) and 148(b).

In another embodiment (not shown), the endwalls 146 and 148 may have several intermediate sections slideably coupled together in the same manner that the intermediate section 146(c) slideably couples the first end section 146(a) to the second end section 146(b) of the first endwall 146. In still another embodiment (not shown), one or both of the endwalls 146 and 148 may be fixedly attached to the sidewalls 42 and 44.

An advantage of the PCB holder 140 shown in FIG. 5 is that the minimum distance between the sidewalls 42 and 44 across the dimension W is less with the endwalls 146 and 148 compared to the sidewalls 46 and 48 of the PCB holder 40 shown in FIGS. 1–4B. The sections of the endwalls 146 and 148 extend across only slightly more than one-third of the maximum width of the PCB holder 140, as opposed to the sections of the endwalls 46 and 48 that extend across slightly more than one-half of the maximum width of the PCB holder 40 (shown in FIG. 4A). Thus, when the endwalls 146 and 148 are in the fully contracted configuration, the minimum distance between the sidewalls 42 and 44 is approximately one-third of the maximum width of the PCB holder 140.

Figure 6:
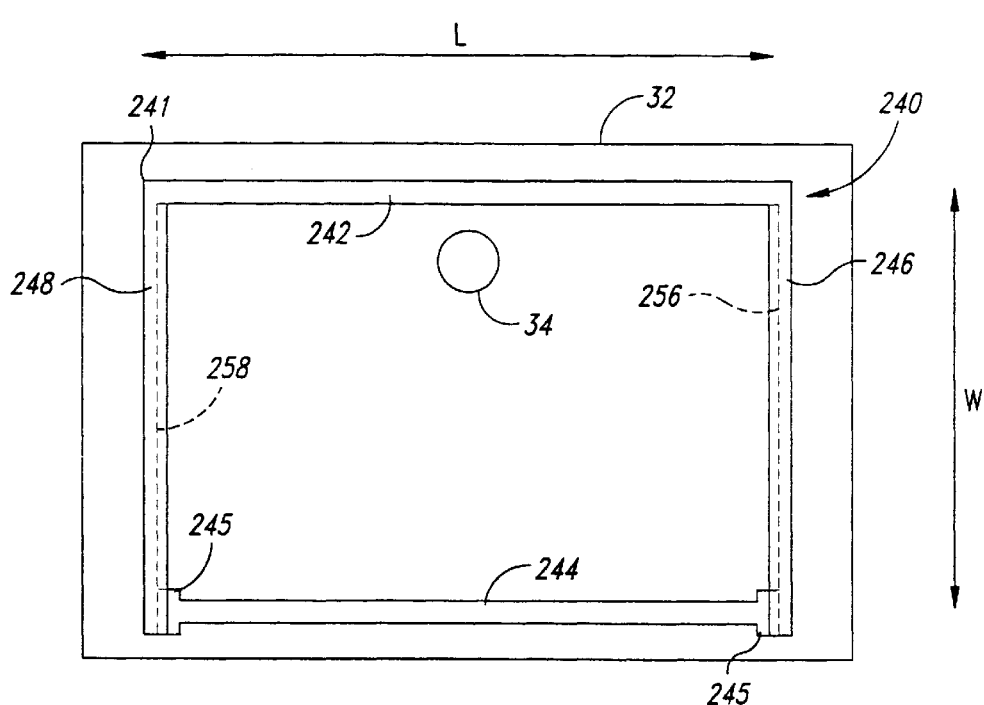
FIG. 6 is a schematic top plan view of another embodiment of a printed circuit board holder in accordance with the invention.

FIG. 6 is a top plan view of another embodiment of a PCB holder 240 in accordance with the invention. The PCB holder 240 has a first support member 241 with a sidewall 242, a first endwall 246 extending transversely to the sidewall 242, and a second endwall 248 spaced apart from the first endwall 246 along the sidewall 242 and extending transversely to the sidewall 242. The PCB holder 240 also has a moveable second support member 244 spaced apart from the sidewall 242. The second support member 244 is preferably attached to slider blocks 245 that are similar to the slider blocks 47 discussed above with respect to FIG. 2. One of the slider blocks 245 is slideably received in a channel 256 extending along the interior wall of the first endwall 246, and the other slider block 245 is slideably received in a channel 258 extending along the interior surface of the second endwall 248. The channels 256 and 258 in the endwalls 246 and 248 of the first support member 241 are preferably similar to the channels 51 and 53 in the sidewalls 42 and 44, as discussed above with respect to FIG. 2.

In operation, the second support member 244 translates along the first and second endwalls 246 and 248 to position the sidewall 242 and the second support member 244 under perimeter regions of a specific PCB. The PCB holder 240 is particularly advantageous to support PCBs that have the same length along the lengthwise dimension L, but different widths along the widthwise dimension W.

Figure 7:
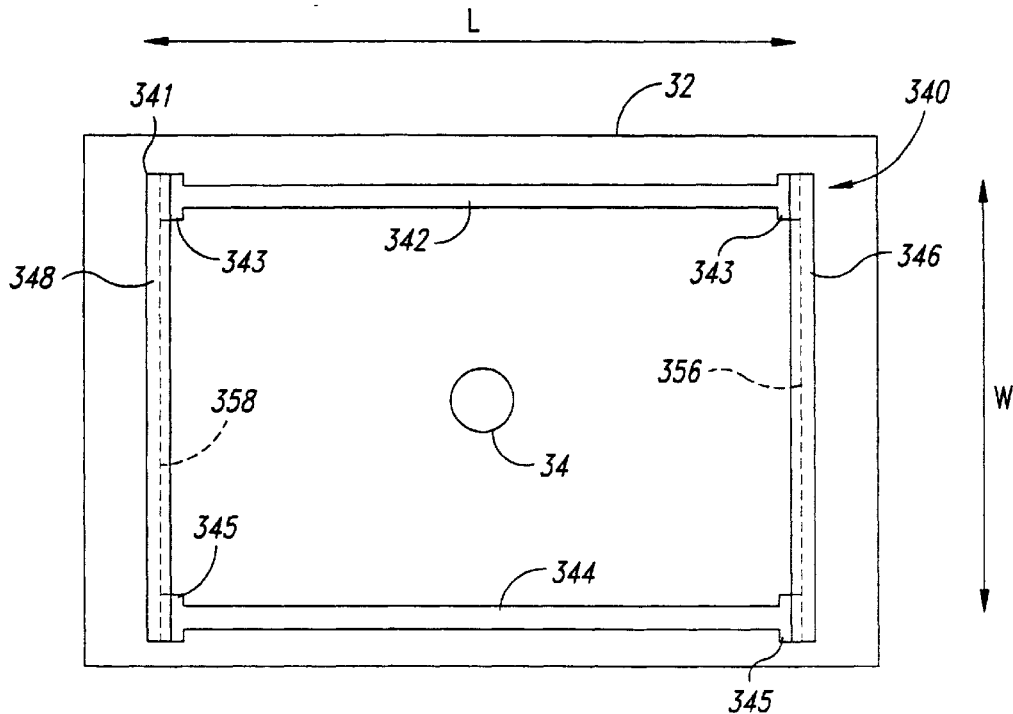
FIG. 7 is a schematic top plan view of another embodiment of a printed circuit board holder in accordance with the invention.

FIG. 7 is a top plan view of another embodiment of a PCB holder 340 in accordance with the invention. The PCB holder 340 has sidewalls 342 and 344 that are slideably connected to endwalls 346 and 348. The sidewall 342 has one slider block 343 slideably received within a channel 356 of the first endwall 346 and another slider block 343 slideably received within a channel 358 of the second endwall 348. Similarly, the sidewall 344 has one slider block 345 slideably received within the channel 356 of the first endwall 346 and another slider block 345 slideably received within the channel 358 of the second endwall 148. The combination of the first sidewall 342, and the endwalls 346 and 348, define a first support member 341 that is similar to the first support member 241 of the PCB holder 240 illustrated in FIG. 6. However, both the first sidewall 342 and the second sidewall 344 translate along the endwalls 346 and 348 to adjust the distance between the endwalls 346 and 348. Accordingly, both the sidewalls 342 and 344 of the PCB holder 340 may be positioned to support printed circuit boards with different sizes across the widthwise dimension W.

Figure 8:
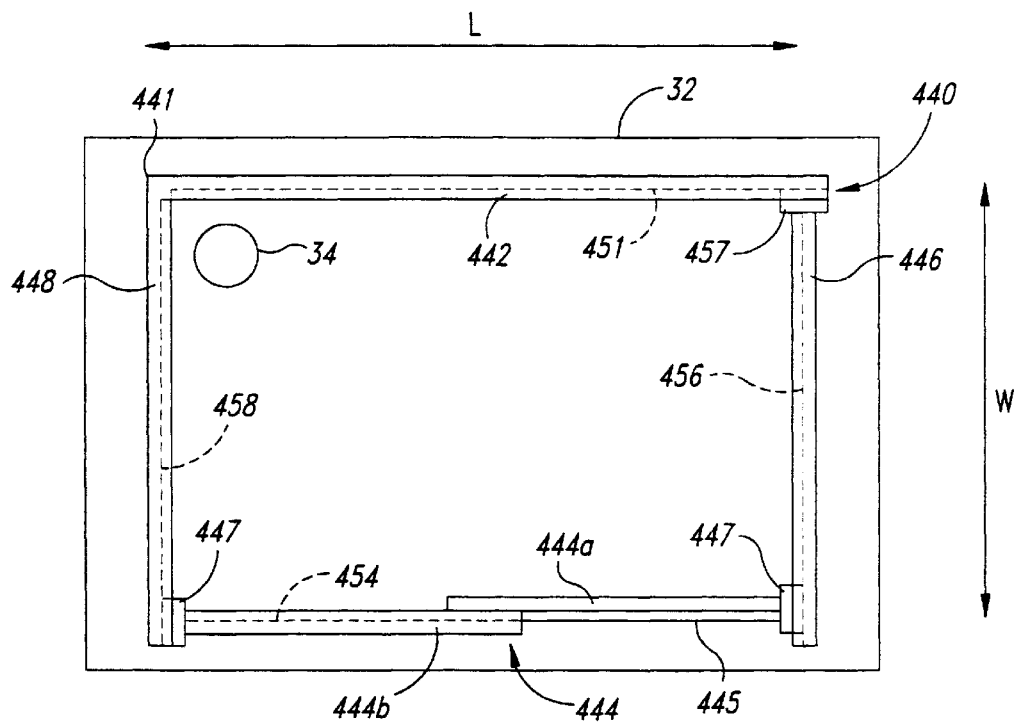
FIG. 8 is a schematic top plan view of still another embodiment of a printed circuit board holder in accordance with the invention.

FIG. 8 is a top plan view of another embodiment of a PCB holder 440 in accordance-with the invention. The PCB holder 440 has a first support member 441 with a sidewall 442, a moveable endwall 446 with a slider block 457 connected to the sidewall 242, and a fixed endwall 448 extending transversely from the sidewall 442. The slider block 457 slideably mates with a channel 451 along the sidewall 442 so that the moveable endwall 446 can translate along the sidewall 442 in the lengthwise direction L. The PCB holder 440 also has a second support member 444 with a first section 444(a) slideably connected to the moveable endwall 446, and a second section 444(b) slideably connected to the fixed endwall 448. The first section 444(a) of the second support member 444 is also slideably connected to the second section 444(b) to adjust the length of the second support member 444 along the lengthwise dimension L. In a preferred embodiment, the first section 444(a) of the second support member 444 has a number of rails 445 slideably received in a number of channels 454 in the second section 444(b). Additionally, the first section 444(a) of the second support member 444 is preferably connected to one slider block 447 that slideably mates with a channel 456 in the moveable endwall 446, and the second section 444(b) of the second support member 444 is preferably connected to another slider block 447 that slideably mates with a channel 458 in the fixed endwall 448.

In operation, the second support member 444 translates along the endwalls 446 and 448 to adjust the distance between the sidewall 442 and the second support member 444. The moveable endwall 446 also translates along the sidewall 442 and drives the first section 444(a) of the second support member 444 along the second section 444(b) to adjust the distance between the endwalls 446 and 448. Accordingly, the PCB holder 440 is adjustable in two dimensions to accommodate PCBs with different sizes along both the lengthwise dimension L and the widthwise dimension W.

Figure 9:
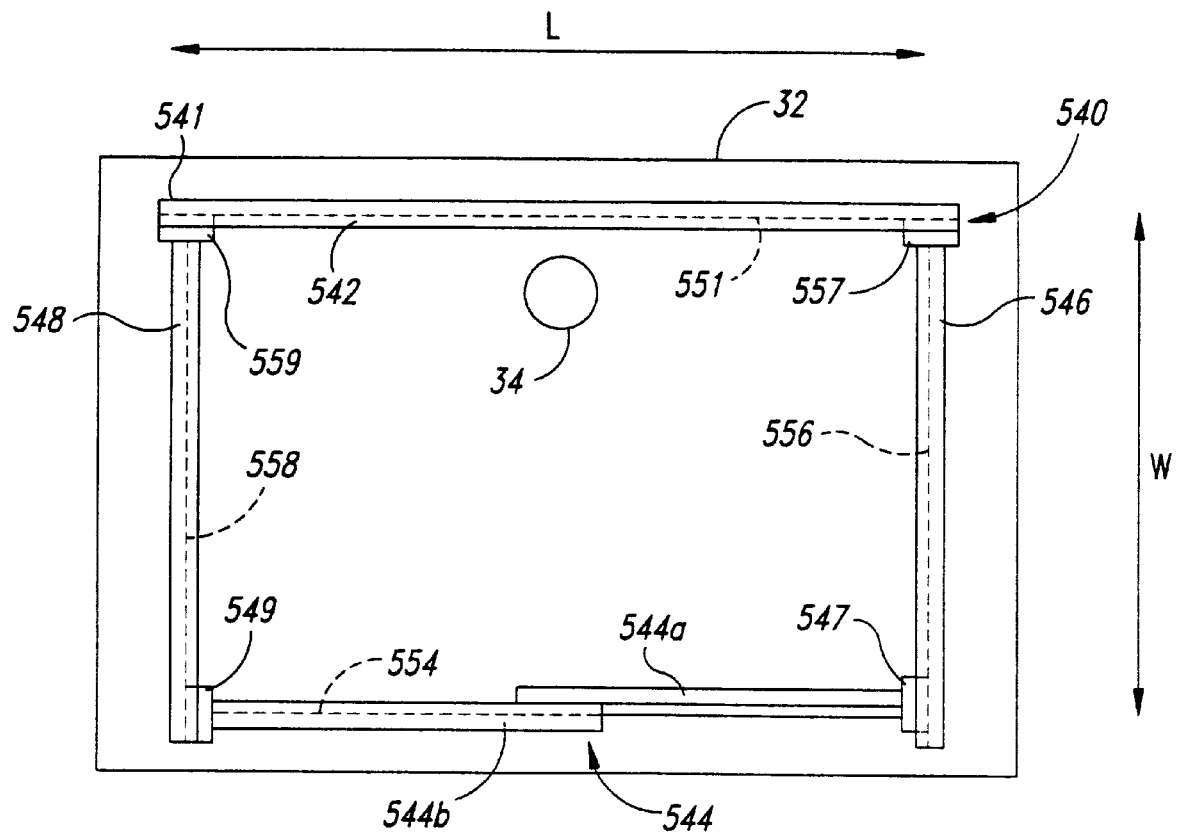
FIG. 9 is a schematic top plan view of a further embodiment of a printed circuit board holder in accordance with the invention.

FIG. 9 is a schematic top plan view of still another embodiment of a PCB holder 540 in accordance with the invention. The PCB holder 540 has a first support member 541 with a sidewall 542, a first moveable endwall 546 with a slider block 557, and a second moveable endwall 548 with a slider block 559. The sidewall 542 preferably has a channel 551 in which slider blocks 557 and 559 mate to allow the endwalls 546 and 548 to translate along the sidewall 542. The PCB holder 540 also has a second support member 544 slideably attached to the endwalls 546 and 548. As with the second support member 444 of the PCB holder 440, the second support member 544 has first and second sections 544(a) and 544(b) that slide with respect to one another. Also, the first section 544(a) of the second support member 544 has a slider block 547 slideably received in a channel 556 along the endwall 546, and the second section 544(b)

has a slider block 549 slideably received in a channel 558 along the endwall 548. In operation, the endwalls 546 and 548 translate along the sidewall 542 to adjust the distance between the endwalls 546 and 548. Also, the second support member 544 translates along the endwalls 546 and 548 to adjust the distance between the second support member 544 and the sidewall 542.

The universal PCB holders illustrated in FIGS. 1–9 may be made from many materials, such as steel, aluminum, plastic, wood and polymeric materials. In a preferred embodiment, the PCB holders are made from a high-density, low-friction material that is easily machined or processed to form the sidewalls and endwalls of the PCB holder. One suitable high-density, low-friction material for making a universal PCB holder in accordance with the invention is Delrin® manufactured by E. I. du Pont de Nemours of Newark, Del.

From the foregoing it will be appreciated that, although specific embodiments of the invention have been described herein for purposes of illustration, various modifications may be made without deviating from the spirit and scope of the invention. Also, even though the embodiments of PCB holders in accordance with the invention have been described for use in PCB stenciling machines, it will be appreciated that PCB holders in accordance with the invention may be used in other PCB processing machines (e.g., component mounting machines). Accordingly, the invention is not limited to the embodiments and uses illustrated in FIGS. 1–9, but only as by the appended claims.

What is claimed is:

1. An adjustable fixture for supporting printed circuit boards with different dimensions during processing, comprising:

a first panel having an elongated top edge, the first panel being adapted to be positioned on a work platform of a printed circuit board stenciling machine;

a second panel abutting the first panel and having an elongated top edge extending transversely with respect to the top edge of the first panel;

a third panel abutting the first panel and having an elongated top edge extending transversely with respect to the top edge of the first panel, the third panel being spaced apart from the second panel along a common side of the first panel;

a fourth panel spaced apart from the common side of the first panel and attached to the second and third panels, at least one of the first and fourth panels being moveable with respect to the other to adjust a distance between the first and fourth panel to support printed circuit boards with different dimensions, and wherein at least one of the second and third panels is slideably attached to the first panel, and the fourth panel comprises an elongated first section attached to the second panel and an elongated second section attached to the third panel, the second section being slideably connected to the first section to translate along a longitudinal axis of the fourth panel and adjust the length of the fourth panel as the at least one of the second and third panels slides along the first panel.

2. The fixture of claim 1 wherein the elongated first section of the fourth panel is slideably attached to the second panel and the elongated second section of the fourth panel is slideably attached to the third panel.

3. The fixture of claim 1 wherein the second and third panels are slideably attached to the first panel.

4. An adjustable fixture for supporting printed circuit boards with different dimensions during processing, comprising:

a first panel having an elongated top edge, the first panel being adapted to be positioned on a work platform of a printed circuit board stenciling machine;

a second panel abutting the first panel and having an elongated top edge extending transversely with respect to the top edge of the first panel;

a third panel abutting the first panel and having an elongated top edge extending transversely with respect to the top edge of the first panel, the third panel being spaced apart from the second panel along a common side of the first panel; and a fourth panel spaced apart from the common side of the first panel and attached to the second and third panels, at least one of the first and fourth panels being moveable with respect to the other to adjust a distance between the first and fourth panel to support printed circuit boards with different dimensions, and wherein the second panel extends between the first and fourth panels, and the second panel comprises an elongated first section attached to the first panel and an elongated second section attached to the fourth panel, the first section of the second panel being slideably connected to the second section of the second panel to provide translation between the first and second sections of the second panel for adjusting the length of the second panel, and the third panel extends between the first and fourth panels, and the third panel comprises an elongated first section attached to the first panel and an elongated second section attached to the fourth panel, the first section of the third panel being slideably connected to the second section of the third panel to provide translation between the first and second sections of the third panel for adjusting the length of the third panel.

5. The fixture of claim 4 wherein the first section of the second panel is slideably connected to the first panel and the second section of the second panel is slideably connected to the fourth panel, the second panel being translatable along the first and fourth panels to adjust a distance between the second and third panels.

6. The fixture of claim 5 wherein the first section of the third panel is slideably connected to the first panel and the second section of the third panel is slideably connected to the fourth panel, the third panel being translatable along the first and fourth panels to adjust a distance between the second and third panels.

* * * * *